(12) United States Patent
Tezuka (10) Patent No.: US 6,880,121 B2
(45) Date of Patent: Apr. 12, 2005

(54) PARALLEL PROCESSING SYNDROME CALCULATING CIRCUIT AND REED-SOLOMON DECODING CIRCUIT

(75) Inventor: Hiroshi Tezuka, Tokyo (JP)

(73) Assignee: NEC Corporation, Tokyo (JP)

( * ) Notice: Subject to any disclaimer, the term of this patent is extended or adjusted under 35 U.S.C. 154(b) by 444 days.

(21) Appl. No.: 10/012,511

(22) Filed: Dec. 12, 2001

(65) Prior Publication Data

US 2002/0042804 A1 Apr. 11, 2002

Related U.S. Application Data

(62) Division of application No. 09/219,324, filed on Dec. 23, 1998, now Pat. No. 6,341,297.

(30) Foreign Application Priority Data

Dec. 26, 1997 (JP) .............................................. 9-368781

(51) Int. Cl.$^7$ ......................... H03M 13/00; G06F 15/00
(52) U.S. Cl. ...................................... 714/784; 708/492
(58) Field of Search ................................ 714/784, 785, 714/752, 781; 708/490–492

(56) References Cited

U.S. PATENT DOCUMENTS

| 5,495,488 A | | 2/1996 | Nakamura ................... 371/37.1 |
| 5,563,896 A | * | 10/1996 | Nakaguchi ................... 714/785 |
| 5,570,377 A | * | 10/1996 | Merino Gonzalez et al. .... 714/785 |
| 5,574,717 A | * | 11/1996 | Tomizawa et al. ........... 370/244 |
| 6,031,875 A | * | 2/2000 | Im .............................. 375/262 |

FOREIGN PATENT DOCUMENTS

| EP | 0 262 944 | 4/1988 |
| EP | 0 852 533 | 2/1998 |
| JP | 6-276106 | 9/1994 |
| JP | 6-348518 | 12/1994 |
| JP | 8-167857 | 6/1996 |
| JP | 9-93142 | 4/1997 |

OTHER PUBLICATIONS

Patent Abstracts of Japan, "Method and Device for Euclid Algorithm", vol. 1998, No. 5, Abstract, (Apr. 1998).

Iwamura et al., "A Construction Method for Ree–Solomon Codec Suitable for VLSI Design", J. Soc. Elec. Information Communication, vol. J71–A, No. 3, pp. 751–759, (Mar. 1998).

* cited by examiner

Primary Examiner—Albert Decady
Assistant Examiner—Cynthia Britt
(74) Attorney, Agent, or Firm—Foley & Lardner LLP

(57) ABSTRACT

A syndrome polynomial calculating circuit and a Reed-Solomon decoding circuit capable of performing a high-speed operation. Higher-order signals I1, I2 and I3 are inputted to first to third Galois field multiplication circuits. For each of S0, S1, S2 and S3, the multipliers are $a^6$, $a^9$, $a^{12}$; $a^2$, $a^4$, $a^6$, $a^8$; a, $a^2$, $a^3$, $a^4$. Outputs of first to third multiplication circuits and I4 are sent to an exclusive-OR gate, an output of which is sent to a D-F/F. An output of the D-F/F is sent to a fourth Galois field multiplication circuit and to an AND gate. For each of S0, S1, S2 and S3, multipliers of the fourth multiplication circuit are $a^4$, $a^8$, $a^{12}$, $a^{16}$. An output of the fourth multiplication circuit is sent to a fifth input of the exclusive OR gate. Clocks are input to the D-F/F and to a counter. The counter value is reset by the inputting of a frame pulse. The counter value is L or H for the counter value of 0 to 4 or 5, respectively. A counter output is sent to the AND gate. A signal from the D-F/F is outputted only if the signal is H.

12 Claims, 8 Drawing Sheets

PRIOR ART

FIG. 8 PRIOR ART

PARALLEL PROCESSING SYNDROME CALCULATING CIRCUIT AND REED-SOLOMON DECODING CIRCUIT

CROSS-REFERENCE TO RELATED PATENT APPLICATIONS

This application is a division of application Ser. No. 09/219,324, filed Dec. 23, 1998, now U.S. Pat. No. 6,341,297, and based on Japanese Patent Application No. 9-368781, filed Dec. 26, 1997 by Hiroshi TEZUKA, both of which are incorporated by reference in their entirety herein. This application claims only subject matter disclosed in the parent application and therefore presents no new matter.

FIELD OF THE INVENTION

This invention relates to a syndrome polynomial calculating circuit and a Reed-Solomon decoding circuit. More particularly, it relates to a Reed-Solomon decoding circuit, preferably applied to a system exemplified by a high-speed large-capacity optical communication system, for which a high throughput is a requirement, and to a syndrome polynomial calculating circuit used in the Reed-Solomon decoding circuit.

BACKGROUND OF THE INVENTION

Conventionally, for a Reed-Solomon decoding circuit, there is known a method of sequentially processing input signals by a systolic array structure as disclosed in a literature "VLSI-oriented Reed Solomon Coding and Decoding System", Journal of the Society of Electronic Information Communication, Vol. J. 71-A, pp. 751 to 759.

Figure 5:
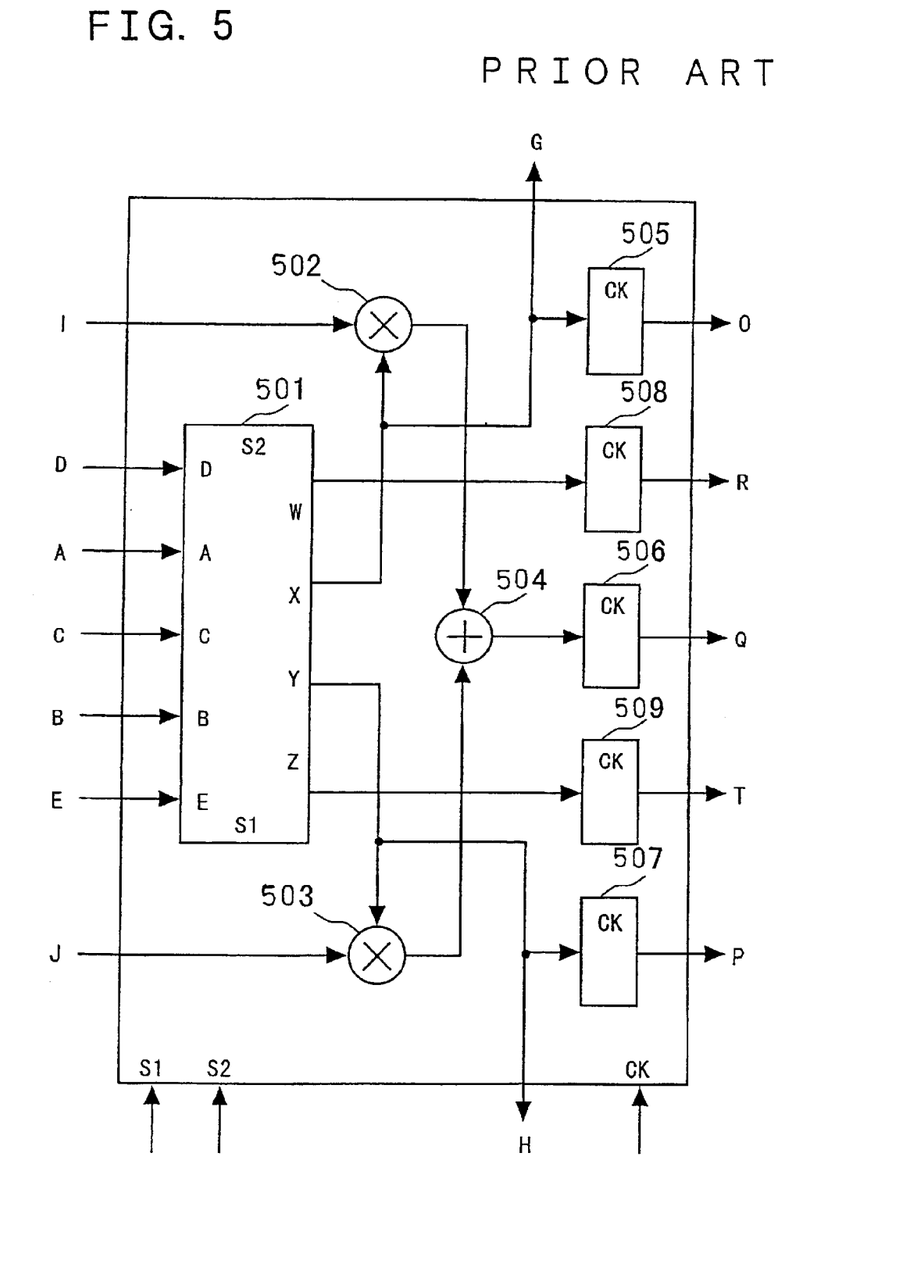
FIG. 5 shows a circuit structure of a PE as a basic unit for Reed-Solomon decoding in the conventional technique.
Figure 6:
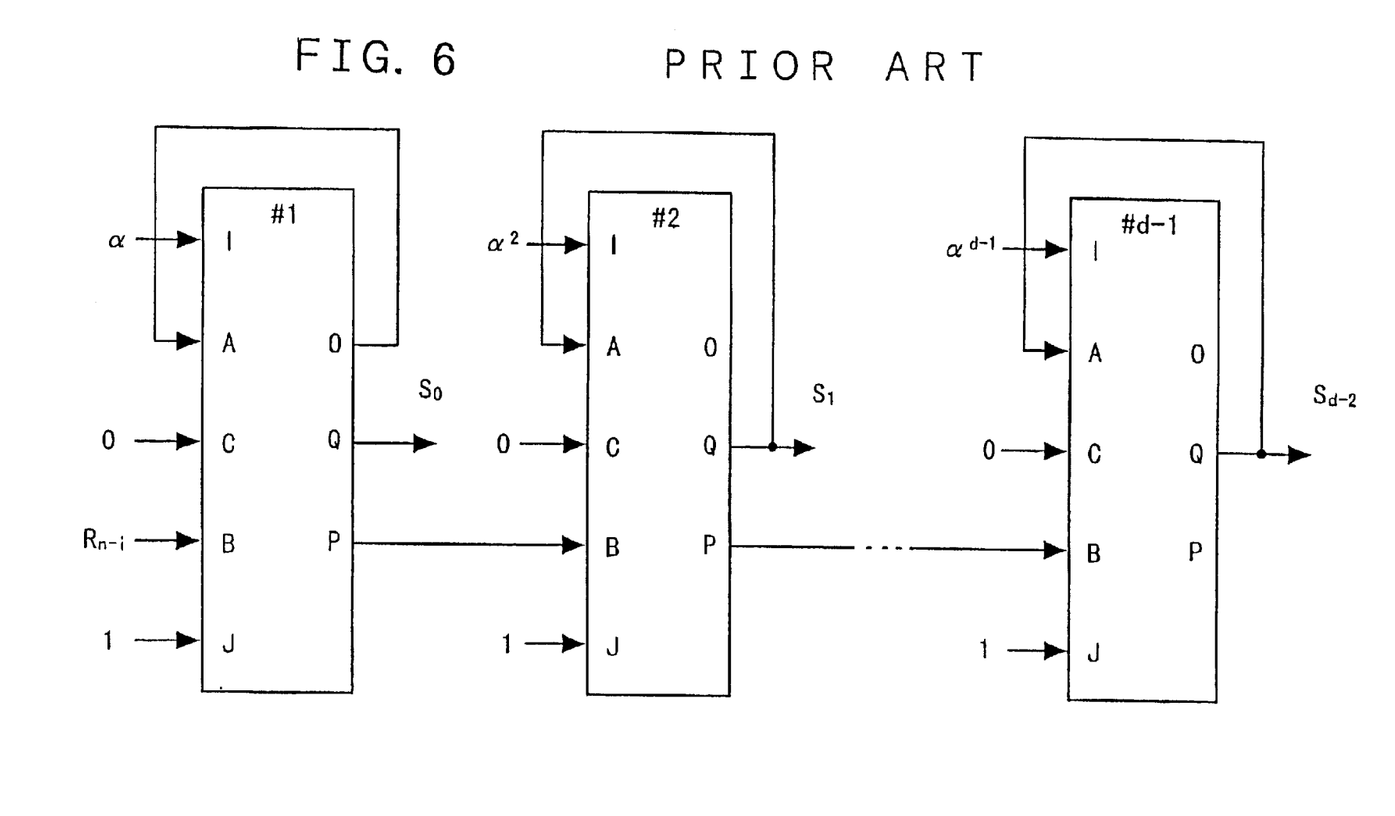
FIG. 6 shows a circuit structure of a syndrome calculating circuit in the conventional technique.

In the system disclosed in the above literature, a unit structure termed PE, shown in FIG. 5, is used for processing. Referring to FIG. 5, seven signals A, B, C, D, E, I and J are entered as input signals, of which the signals A, B, D and E are sent to a selector 501, that is also fed with control signals S1 and S2. A first output of the selector 501 is sent to a second D-flipflop (D-F/F) 508, while a second output thereof is branched into three which are entered to a first input of a first Galois field multiplication circuit 502 and to an input of the first D-flipflop 505 (D-F/F) and are output to an output G.

A third output of the selector 501 is branched into three which are entered to a first input of a second Galois field multiplication circuit 503 and to an input of the fifth D-flipflop 507 (D-F/F) and are output to an output H.

An input signal I is entered to a second input of the first Galois field multiplication circuit 502, while an input signal J is entered to a second input of the second Galois filed multiplication circuit 503.

An output of the first Galois filed multiplication circuit 502 is entered to a first input of an exclusive OR circuit 504, while an output of the second Galois filed multiplication circuit 503 is entered to a second input of the exclusive OR circuit 504.

Outputs of the first to fifth D-F/Fs 505, 508, 506, 509 and 507 are issued as outputs O, R, Q, T and P, respectively.

In the conventional example, a variety of processing operations is performed on the PE as a unit. A syndrome polynomial calculating unit, an Euclidean algorithm method, Chain solution and an error value calculation unit are implemented by interconnecting PEs.

The syndrome polynomial calculating unit is implemented by interconnecting (K+1) PEs in series, a to $a^{(K+1)}$.

Also, C is fixed at "0", J is fixed at "0" and an output of P of a previous stage PE is entered to B. In this case, a Q-output of the PE of the last stage becomes an output of the syndrome polynomial.

As for outputs of a selector, C and B are selected in the first PE as outputs of X and Y, respectively. In the following PEs, A and B are selected as X and Y, respectively.

In the Euclidean algorithm calculating unit, (K+2) PEs are connected in series, and outputs of respective previous stage(s) R, Q and T are entered to A, C and B of the next stage(s).

Figure 7:
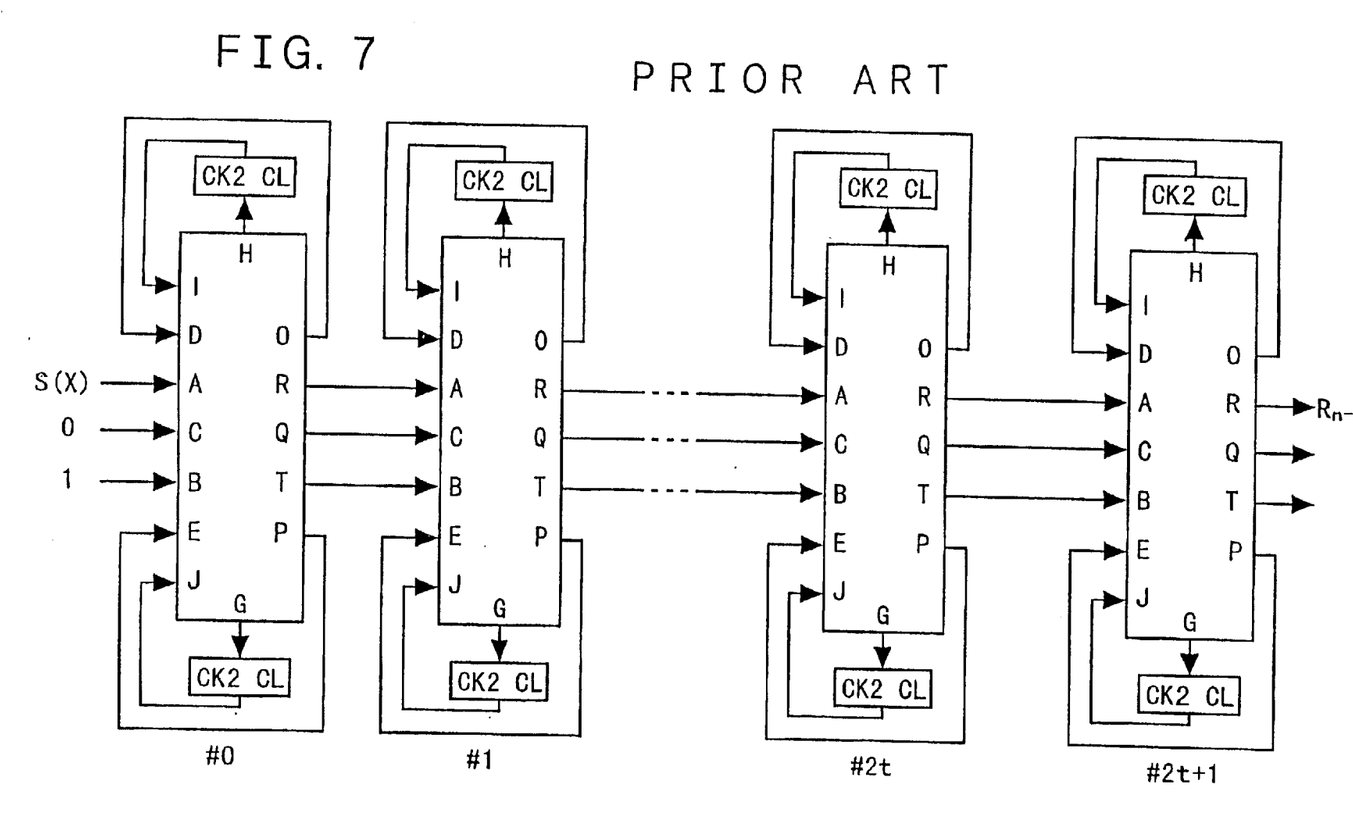
FIG. 7 shows a circuit structure of a Euclidean algorithm calculating circuit in the conventional technique.

In the individual PEs, outputs of H and G are entered to a respective register which holds initially entered values. The register holds the value during calculation processing to enter the values to inputs I and J, respectively, as shown in FIG. 7.

Also, outputs O and P are sent to inputs D and E, respectively. In the initial stage PE, the calculated results of the syndrome polynomial are entered to A, while C is fixed at "0", and "1" is entered only at the initial bit of B.

In the respective PEs, signals selected by the selectors are changed depending on the processing results of the previous stage(s). That is, for the respective PEs, the mode is changed to nop, reDuceA and reDuceB, depending on the order number of the output signals R, Q and T. In keeping therewith, A and B are selected for X and Y, respectively, in the downstream side selector in the case of nop. In the case of reDuceA, C and B are selected for X and Y, respectively, whereas, in the case of reDuceB, A and C are selected for X and Y, respectively.

This outputs an error position polynomial and an error value polynomial from R and Q of the last-stage PE, respectively.

Figure 8:
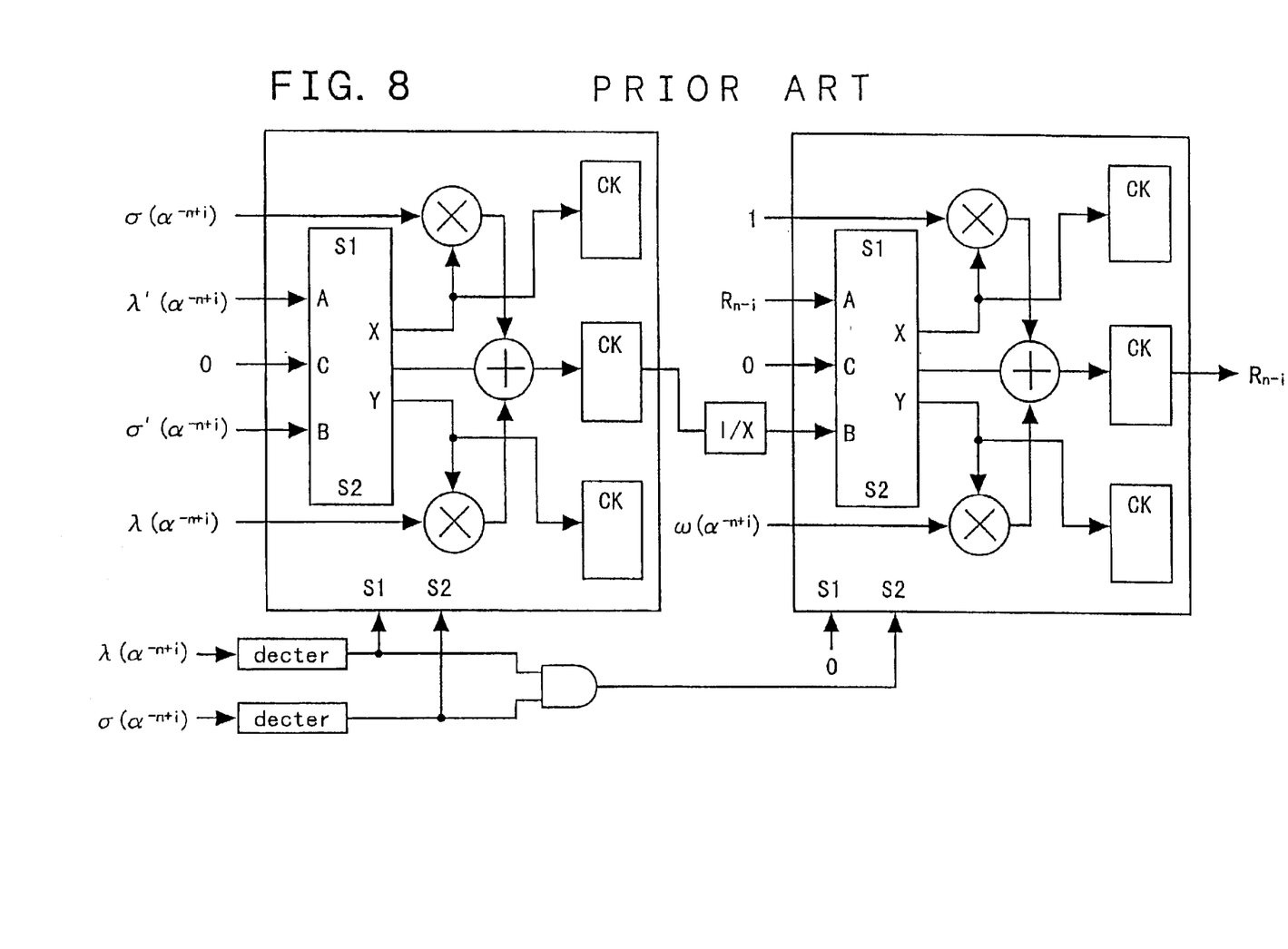
FIG. 8 shows a circuit structure of an error correction unit calculating circuit in the conventional technique.

In the downstream side, two PEs are configured as a reciprocal calculating circuit of the Galois field, as shown in FIG. 8. To I, J, A and B are entered polynomials calculated by the Euclidean algorithm method and differentiated values thereof. An output Q of the initial stage PE is sent to a Galois field reciprocal calculating circuit, an output of which is sent to an input B of the next stage PE. In this case, the signal of an output Q of the last stage PE serves as the information of the error position and the error value, by which the error values are corrected.

SUMMARY OF THE INVENTION

However, if, with the above-described conventional technique, high-speed signals are to be decoded, the syndrome circuit needs to be operated by clocks of the same rate as the signal. Thus, for processing a large capacity signal of the order of Gb/s, the signals are time-divisionally multiplexed to an allowable processing speed prior to processing. This raises a problem of an increased device scale.

There is raised a further problem of signal delay caused by signal separation.

Since the Euclidean algorithm circuit, Chain solution circuit or the error value calculation unit can be operated also at a speed slower than the signal speed, speedup of the processing speed of the syndrome circuit is crucial in decoding.

In view of the above-mentioned problems, it is an object of the present invention to provide a syndrome polynomial calculation circuit and Reed Solomon compounding circuit capable of performing a high-speed operation.

For accomplishing the above object, a first aspect of the present invention provides a Galois field substitution circuit which includes first to jth Galois field multiplication circuits, and a (j+1) input exclusive OR circuit. A first block of j blocks of input time-divisionally multiplexed signals is entered to a first input of the exclusive OR gate, second to ith block signals are entered to the first to (j−1)th Galois field multiplication circuits, and outputs of the first to (j−1)th Galois field multiplication circuits are entered to second to jth inputs of the exclusive OR gate.

The Galois field substitution circuit also includes a latch circuit for latching an output of the exclusive OR gate with input clock signals, a counter for setting a control output signal to logical 1 on counting the input clock signals by one frame, and a gating circuit for selectively outputting an output of the latch circuit based on the control output signal of the counter.

An output of the latch circuit is entered to the jth Galois field multiplication circuit, and an output of the jth Galois field multiplication circuit is connected to a (j+1)st input of the exclusive OR gate. A multiplication circuit of each Galois field is designed such that the power of the Galois field "a" is p to jp. The output of the latch circuit and the counter are reset at a time point of inputting of the one-frame signal.

In a syndrome polynomial calculating circuit according to a second aspect of the present invention, j-blocks of input signals are branched into two signal portions, one of which is entered to second to (j+1)th D-flipflops and the other of which is entered to the Galois field substitution circuits. K of the circuits are connected in series, with outputs of each of the Galois field substitution circuits being entered to a logical sum circuit. An output of the logical sum circuit is issued as an output of the syndrome polynomial calculating circuit.

In a third aspect of the present invention, there is provided a Reed-Solomon decoding circuit which includes the syndrome polynomial calculating circuit aforementioned, a Euclidean algorithm calculating circuit, first to Kth Chain solution method calculating circuits, first to Kth error value calculating circuits, a signal separating circuit, a shift register circuit and an error correction circuit.

j blocks of input signals are branched into two signal portions, one of which is entered to the syndrome polynomial calculating circuit and the other of which is entered to the shift register. An output of the syndrome polynomial calculating circuit is entered to the Euclidean algorithm calculating circuit. The results of calculation of the error position polynomial of the Euclidean algorithm calculating circuit are branched into K which are respectively entered to the first to Kth chain solution method calculating circuits. The results of calculation of the error value polynomial calculation units of the Euclidean algorithm calculating circuit are branched into K which are respectively entered to the error value polynomial calculation units of the error value calculating circuits. An output of the shift register circuit and outputs of the first to Kth error magnitude value calculating circuits are entered to the error correction circuit. As for the order number of the Galois field substituted in the first to Kth error value calculating circuits, the Galois field is entered by K orders each time beginning from 1 to K. The Chain solution method calculating circuits, error value calculating circuits, the shift register and the error correction unit are operated with clocks corresponding to 1/K clocks of the input signal.

According to a fourth aspect of the present invention, there is provided a Galois field substitution circuit of $a^p$ in a syndrome polynomial calculating circuit comprising:

(a) first to jth Galois field multiplication circuits;
(b) a (J+1) input exclusive OR circuit;
wherein a first block of j blocks of input time-divisionally multiplexed signals is entered to a first input of said exclusive OR gate, second to jth block signals being entered to said first to (j−1)th Galois field multiplication circuits, and outputs of said first to (j−1)th Galois field multiplication circuits being entered to second to jth inputs of said exclusive OR gate;
(c) a latch circuit for latching an output of said exclusive OR gate with input clock signals;
(d) a counter for setting a control output signal to logical 1 on counting said input clock signals by one frame; and
(e) a gating circuit for selectively outputting an output of said latch circuit based on said control output signal of said counter;
(f) wherein an output of said latch circuit is entered to said jth Galois field multiplication circuit;
(g) wherein an output of said jth Galois field multiplication circuit is connected to a (j+1)st input of said exclusive OR gate; and
(h) wherein multiplication circuits of each Galois field are designed such that the Galois field a has power of p to jp.

In this case, an output of said latch circuit and the counter are reset at a time point of inputting said one frame.

In a fifth aspect of the present invention, there is provided a syndrome polynomial calculating circuit comprising:
a j-bit-length shift register to which input signals are entered in parallel;
j of said Galois field substitution circuits of claim 4 having outputs of respective stages of said shift register as inputs; and
a logical sum circuit having outputs of said Galois field substitution circuits as inputs and having a logical sum thereof as a syndrome polynomial calculation output.

DETAILED DESCRIPTION OF THE PREFERRED EMBODIMENTS

The present invention will now be explained with reference to its preferred embodiments.

Figure 1:
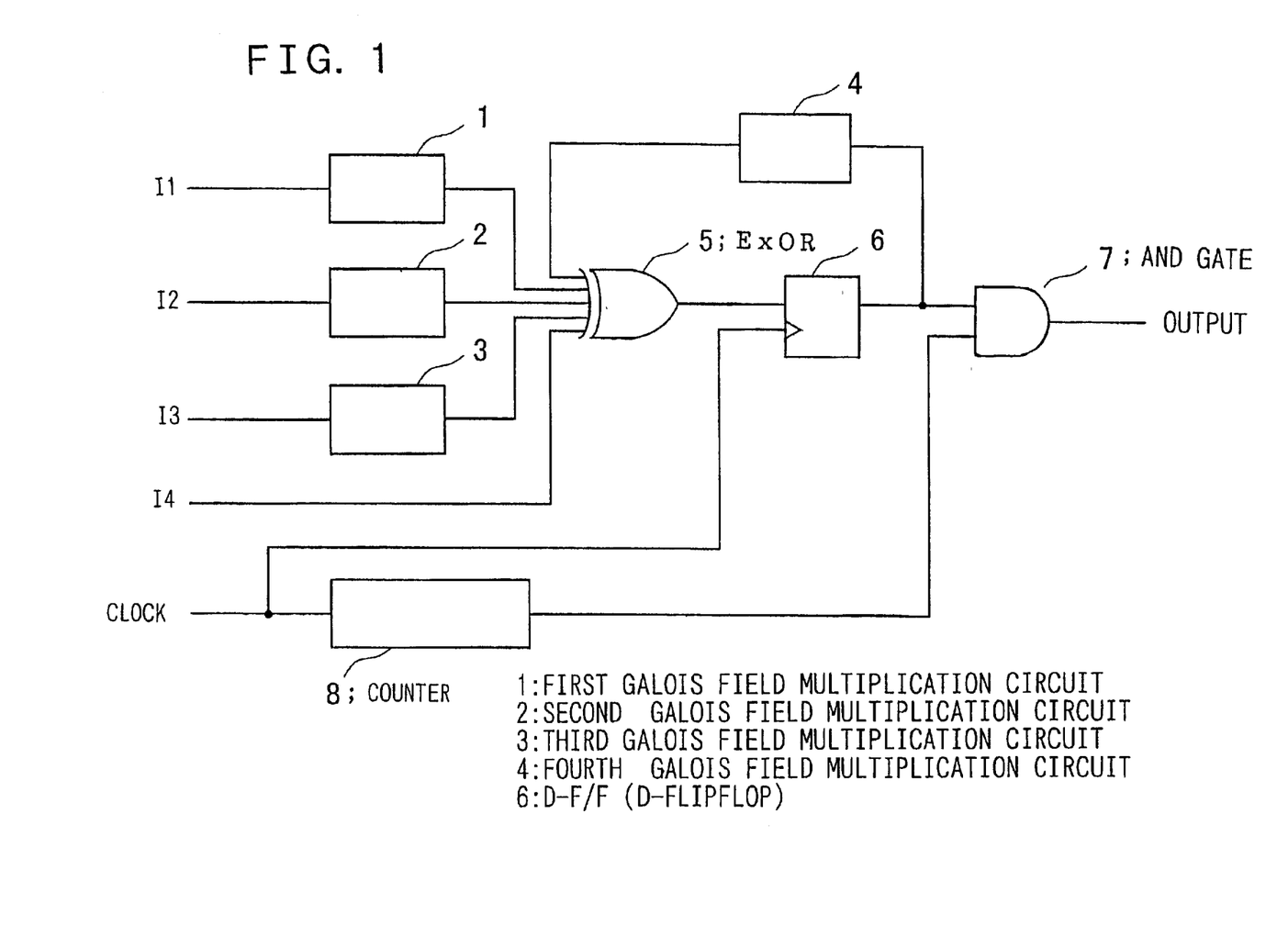
FIG. 1 shows a circuit structure of a Galois field substitution circuit according to a first embodiment of the present invention.

In a preferred embodiment, the Galois field substitution circuit of the present invention is made up of j Galois field multiplication circuits (1, 2, 3 and 4 of FIG. 1 in which j=4), an exclusive OR gate having (j+1) inputs (5 of FIG. 1), D-F/F (D-flipflop) and a selector circuit (7 of FIG. 1). As input signals, j-blocks of time-divisionally multiplexed (separated) signals are entered, of which the first 1 block signal (I4) is sent to a first input of the exclusive OR gate (5 of FIG. 1) and the second to jth block signals are entered to first to (j−1)th Galois field multiplication circuits (1, 2 and 3 of FIG. 1). Outputs of the first to (j−1)th Galois field multiplication circuits are sent to second to jth inputs of the exclusive OR gate, an output of which is sent to the D-F/F. An output of the DF/F is branched into two one of which is sent to the jth Galois field multiplication circuit (4 of FIG. 1) and the other of which is sent to the first input of the selector circuit (7 of FIG. 1). An output of the jth multiplication circuit is sent to the (j+1)th input of the exclusive OR gate (5 of FIG. 1).

In the preset embodiment of the present invention, the second input of the selector is normally fixed at Low. The selector circuit selects the second input for outputting until the inputting of one frame comes to a close. At the same time as an output of the D-F/F is reset, after inputting of one frame comes to a close, the selector circuit outputs the first input for one clock time. Each Galois field multiplication circuit is constituted by a Galois field a, the power of which being p to jp, i.e., $a^p$ to $a^{jp}$.

In a preset embodiment of the syndrome polynomial calculating circuit, j-block input signals are entered to a shift register (9 of FIG. 2) made up of j tandem-connected D-F/Fs. Outputs of the respective stages of the D-F/Fs are entered to the above-mentioned Galois field substitution circuits (10, 11, 12 and 13 of FIG. 2). Outputs of the Galois field substitution circuits are sent to a logical sum circuit (14 of FIG. 1), an output of which is issued as an output of the syndrome polynomial calculating circuit.

Figure 3:
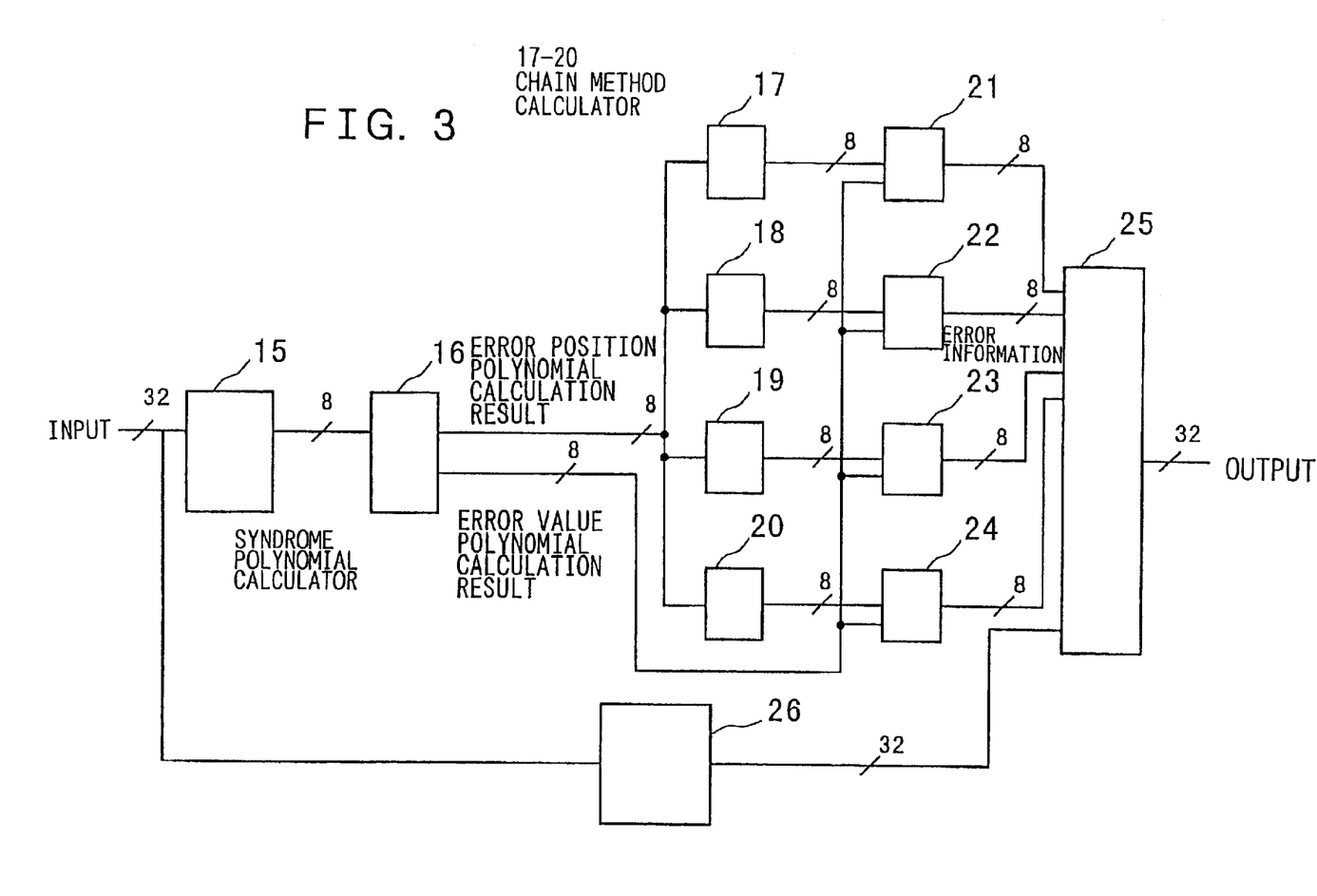
FIG. 3 shows a circuit structure of a Reed-Solomon decoding circuit according to a third embodiment of the present invention.

The Reed-Solomon decoding circuit of the present invention includes, in its preset embodiment, the above-mentioned syndrome polynomial calculating circuit (15 of FIG. 3), an Euclidean algorithm method calculation circuit (16 of FIG. 3), first to Kth chain solution calculating circuits (17 to 20 of FIG. 3), K being 4 in FIG. 3, first to Kth error value calculating circuits (21 to 24 of FIG. 3), a shift register circuit (26 of FIG. 3) and an error correction circuit (25 of FIG. 3).

On the other hand, j blocks of input signals are branched into two one of which is sent to a syndrome polynomial circuit (15 of FIG. 3), and the other of which is sent to a shift register (26 of FIG. 3). The results of calculation of the error position polynomial of the Euclidean algorithm calculation circuit are branched into K which are respectively sent to first to Kth chain solution method calculation circuits (17 to 20 of FIG. 3). The results of calculation of the error value polynomial of the Euclidean algorithm calculation circuit are branched into K which are respectively sent to an error value polynomial calculating circuits (21 to 24 of FIG. 3). Outputs of the first to Kth chain solution method calculation circuits are sent to error position inputs of the first to Kth error value calculating circuits, respectively An output of the shift register (26 of FIG. 3) and outputs of the first to Kth error value calculating circuit are sent to the error correction circuit 25. The order number of the Galois field substituted by the first to Kth chain solution method calculating circuits are entered by K order(s) each time beginning from 1 to K. The chain solution method calculating circuit, error value calculating circuit, shift register and the error correction unit operate by 1/K clock of the input signal.

The syndrome polynomial in the present invention can be explained by the following calculations:

The syndrome polynomial can be found by substituting a, $a^2, \ldots, a^{16}$ into a reception word Y(z).

That is, a coefficient S1 of the syndrome polynomial is calculated by $$Si = \sum_{j=0}^{254} rj \cdot a^{(i+1) \cdot j}$$

$(i = 0, 1, \ldots, 15)$ (1)

For sequentially calculating the equation for the sequentially received reception word $r_j$, the equation (1) is rewritten to $$Sj = ((r254 \cdot a^{i+1} + r253) \cdot a^{i+1} + r252) + r1) \cdot a^{i+1} + r\,0 \quad (2)$$

so that calculations can be made sequentially by $$Sij \cdot (Sij+1 \cdot a^{i+1} + Ij) \quad (3)$$

If this is considered in terms of parallel processing, it suffices if the signal of the highest order is multiplied by $a^{((j-1) \cdot (l+1))}$ and if the value of (j−1) is decremented one by one each time the order number falls by one. It is noted that j is the value of parallel processing.

The syndrome polynomial is calculated by taking the exclusive OR of all signals, multiplying the result by $a^{(j \cdot (l+1))}$ and taking the exclusive OR of the result with the next result of calculations.

For further detailed description of the embodiment of the present invention, reference is had to the embodiment of the present invention shown in the drawings.

Embodiment 1

A first embodiment of the present invention is explained. In a syndrome calculation circuit in the first embodiment of the present invention, the Galois field is adapted to cope with the 8-bit information calculated from $x^8+x^4+x^2+1$. Assume that the decoded information is 28 bytes, with the redundant code being 4 bytes. It is assumed that the present embodiment can correct two bytes.

In this case, the syndrome polynomial is a three-order polynomial. If the generating polynomial is $$G(x) = (x+a)(x+a^2)(x+a^3)(x+a^4) \quad (4)$$

then, coefficients S0, S1, S2 and S3 of the syndrome polynomial can be found by substituting a, $a^2, a^3, a^4$ in the information signals I(x), respectively.

FIG. 1 shows a circuit structure used for calculating the coefficients of each syndrome polynomial. The syndrome is calculated in parallel since a large number of signals are handled at a time.

As input signals, four bytes are entered in parallel. The input signals are termed I1, I2, I3 and I4, in the sequence of the falling number of orders. The signal I1 is sent to a first Galois field multiplication circuit 1, the multipliers of which are $a^3, a^6, a^9$ and $a^{12}$ for S0, S1, S2 and S3, respectively.

Similarly, I2 is entered to a second Galois field multiplication circuit 2, the multipliers of which are $a^2, a^4, a^6$ and $a^8$ for S0, S1, S2 and S3, respectively.

The signal I3 is sent to a third Galois field multiplication circuit 3, the multipliers of which are a, $a^2, a^3, a^4$ for S0, S1, S2 and S3, respectively.

Outputs of the first to third Galois field multiplication circuits 1 to 3 and I4 are sent to first to fourth inputs of the exclusive OR gate 5.

An output of the exclusive OR gate 5 is sent to a data input of a D-flipflop 6. An output of the D-flipflop 6 is branched into two, one of which is sent to a fourth Galois field multiplication circuit 4 and the other of which is sent to a first input of a logical product (AND) gate 7. The multipliers of the fourth Galois field multiplication circuit 4 are $a^4$, $a^8$, $a^{12}$ and $a^{16}$ for S0, S1, S2 and S3, respectively. The output of the fourth Galois field multiplication circuit 4 is entered to an input of the exclusive OR gate 5.

On the other hand, clocks are sent to a clock input of the D-flipflop 6 and to a counter 8. The counter value is reset, that is cleared to zero, when a frame pulse is entered. If the counter value is 0 to 6, a Low level signal is output and, when the counter value is 7, the signal is changed to High to reset the clock counter value.

An output of the counter 8 is sent to a second input of the AND gate 7. A signal from the D-flipflop 6 is output only when the output signal of the counter 8 is at the High level. Also, the D-flipflop 6 is reset by a frame pulse input.

By this circuit structure, the respective coefficients of the syndrome polynomial can be calculated.

Embodiment 2

Figure 2:
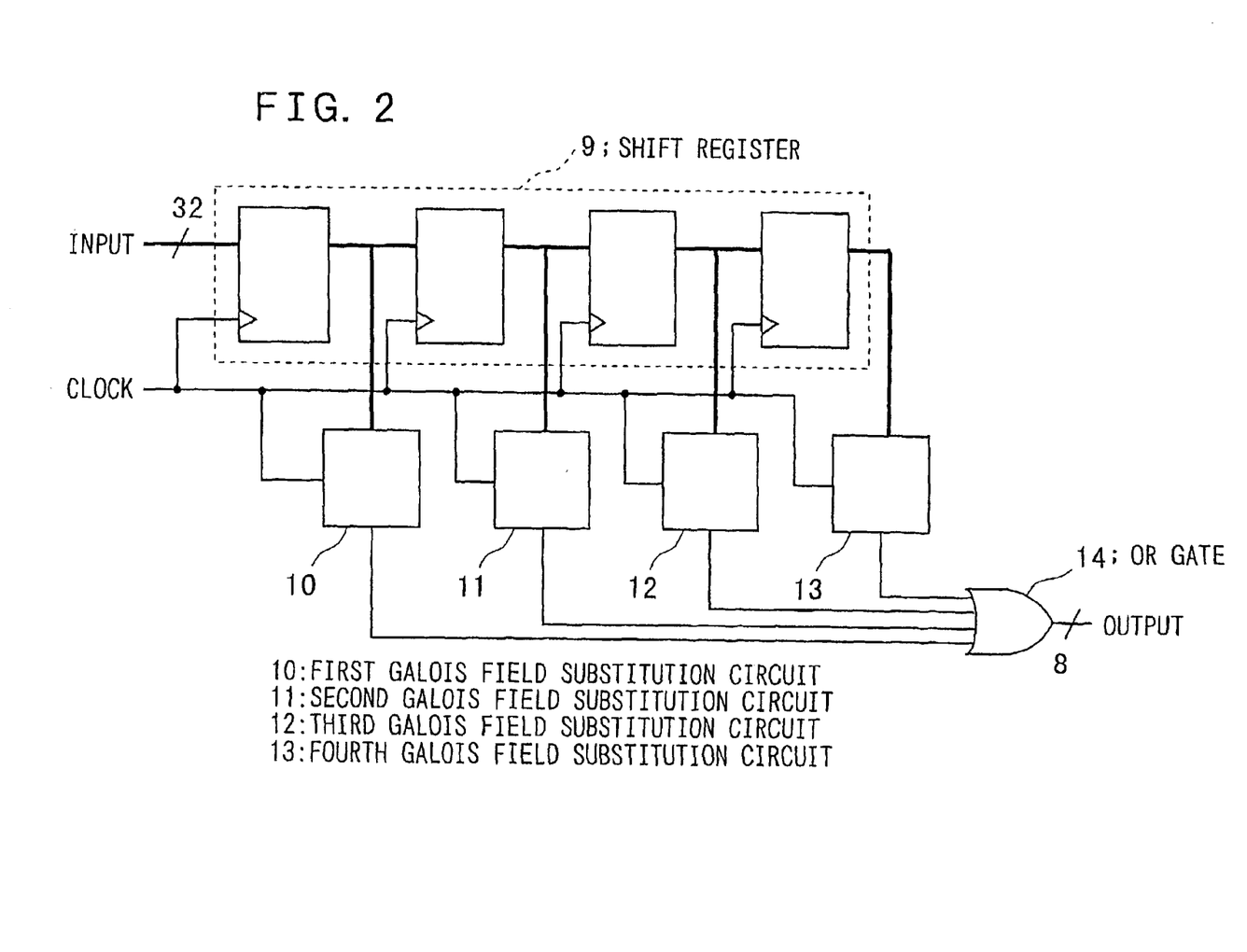
FIG. 2 shows a circuit structure of a syndrome polynomial calculating circuit according to a second embodiment of the present invention.

The coefficient calculating circuit of the syndrome polynomial in the Embodiment 1 is deemed to be one unit, specifically, as a block shown in FIG. 2.

Referring to FIG. 2, an input 4-byte parallel signal (of the 32-bit width) and a frame pulse are input to a 4-bit shift register circuit 9, the outputs of which are input to first to fourth coefficient calculating circuits 10, 11, 12 and 13 of the syndrome polynomial calculating circuit.

Outputs of the first to fourth coefficient calculating circuits 10, 11, 12 and 13 are sent to first to fourth inputs of a logical sum (OR) gate 14.

Figure 4:
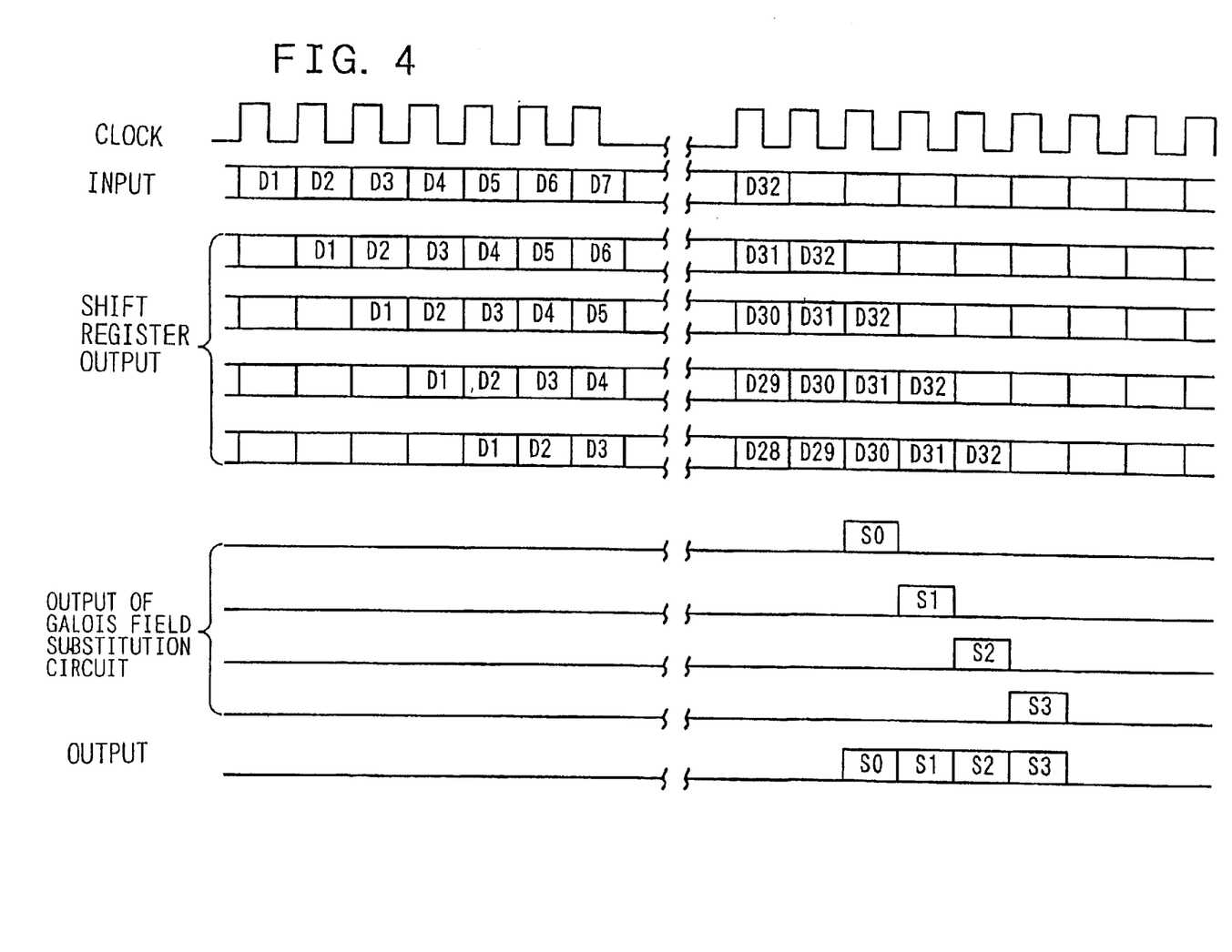
FIG. 4 is a timing chart showing an example of the operation of a syndrome polynomial calculating circuit according to the second embodiment of the present invention.

The time chart of the respective signals is as shown in FIG. 4, from which it is seen that, since outputs of the coefficient calculating circuits 10, 11, 12 and 13 are shifted by one clock in keeping with the operation of the shift register 9, an output of the OR gate 14 is a serial signal.

Embodiment 3

FIG. 3 shows the structure of a third embodiment of the present invention. In this figure, a decoding circuit of the preset embodiment is made up of a syndrome polynomial calculating circuit 15, a Euclidean algorithm calculating unit 16, first to fourth Chain solution (or search) calculation method units 17, 18, 19 and 20, first to fourth error value calculating units 21, 22, 23 and 24, a shift register 26 and an error correction unit 25. Similarly to the first embodiment, the preset embodiment handles a signal in which one-frame is comprised of 28-byte information signal with appended 4-byte redundant code.

The 4-byte parallel input signal (32 bits) is branched into two, one of which is sent to the syndrome calculating circuit 15, and the other of which is sent to the shift register 26.

The 1-byte parallel output signal of the syndrome calculating circuit is entered to the Euclidean algorithm calculating unit 16 which then outputs results of the error value calculation and results of the error position calculation. The results of the error value calculation are branched into four which are sent to the first to fourth chain solution method units 17 to 20, respectively, while the results of the error position calculation are branched into four which are sent to the first to fourth error value calculating units 21 to 24, respectively.

The results of calculations of the first to fourth chain solution method unit 17 to 20 are sent to the first to fourth error magnitude calculating units 21 to 24, respectively, output signals of which are issued as one-byte parallel signals and entered to the error correction unit 25.

One of the two branched 4-byte parallel signal portions may be time-divisionally multiplexed by a multiplexing circuit by 1:4 before being sent to the shift register 26. The output of the shift register 26 is sent to the error correction unit 25.

At this time, error correction is carried out by the error information calculated by the syndrome polynomial calculation, Euclidean algorithm, Chain solution calculation units and the error value calculating units, and by an output of the shift register, in order to output the results of decoding.

The syndrome calculation circuit is similar in the structure to that of the second embodiment so that processing can be executed at a low signal speed. The processing for the Euclidean algorithm can be executed in keeping with the speed of the outputting of the results of the syndrome calculations.

The chain solution method calculation unit or the error value calculation circuit unit also can be driven by clocks of the same rate as the input signal speed.

It should be noted that the present invention is not limited to the stricture of the above-described embodiments. Instead, signals of a still larger capacity can be processed by increasing the degree of parallel signal processing.

The meritorious effect of the present invention are summarized as follows.

By employing the syndrome polynomial calculating circuit according to the present invention, there is derived a meritorious effect that a Reed-Solomon decoding circuit can be constructed which can process a large volume of signals at an elevated speed. The reason is that, in the above-described structure of the present invention, a syndrome calculating circuit can execute processing at a signal speed lower than that for input signals.

Further advantage is achieved in the simplified, compact structure.

Further objectives and advantages of the invention will become apparent in the entire disclosure.

It should be noted that other objects of the present invention will become apparent in the entire disclosure and that modifications may be done without departing the gist and scope of the present invention as disclosed herein and appended herewith.

Also it should be noted that any combination of the disclosed and/or claimed elements, matters and/or items may fall under the modifications aforementioned.

What is claimed is:

1. A syndrome polynomial calculating circuit comprising:
   j D-flipflops connected in series and receiving j-blocks of input signals;
   K Galois field substitution circuits, each connected to receive one output of one of said j D-flipflops;
   a logical sum circuit receiving as an input thereto an output from each of said Galois field substitution circuits;
   an output of said logical sum circuit issued as an output of the syndrome polynomial calculating circuit, where K and j are integers.

2. The syndrome polynomial calculating circuit as defined in claim 1, wherein each of said Galois field substitution circuits comprises:

j Galois field multiplication circuits;
an exclusive OR circuit having (j+1) inputs;
a D-flipflop;
a selector circuit; and
a counter circuit; wherein (a) j blocks of time divisionally multiplexed signals are entered as input signals, of which a first one block signal is entered to a first input of said exclusive OR circuit, with second to jth block signals being entered to inputs of first to (j−1)th Galois field multiplication circuits, respectively;

(b) outputs of said first to (j−1)th Galois field multiplication circuits are fed to second to jth inputs of said exclusive OR circuit;

(c) an output of said exclusive OR circuit is fed to a data input terminal of said D-flipflop;

(d) an output of said D-flipflop is branched into two, one of which is fed to the jth Galois filed multiplication circuit and the other of which is entered to a first input of said selector circuit;

(e) an output of said jth Galios field multiplication circuit is fed to a (j+1)th input of said exclusive OR circuit;

(f) input clock signals are fed to a clock terminal of said D-flipflop and to said counter;

(g) a control signal output by said counter is fed to a second input of said selector circuit as a selection control signal;

(h) said counter counts each one-frame signal input and sets the selection control signal to a first logical state when the counter value is the last inputting of each one-frame signal, and otherwise sets the selection control signal to a second, opposite logical state;

(i) said selector circuit selecting as an output therefrom the output of the D-flipflop fed to the first input of the selector circuit only when the selection control signal has said first logical state; and (j) an output of the D-flipflop and the counter value are reset after inputting of each one-frame input, and wherein (k) the Galois field multiplication circuits have each a Galois field a with power of p to jp.

3. A Reed-Solomon decoding circuit comprising:
(a) a syndrome polynomial calculating circuit;
(b) a Euclidean algorithm calculating circuit;
(c) first to Kth chain solution method calculating circuits, K being an integer;
(d) first to Kth error value calculating circuits;
(e) a shift register circuit; and
(f) an error correction circuit; wherein (g) j blocks of input signals are branched into two, one of which is entered to said syndrome polynomial calculating circuit and the other of which is entered to said shift register, j being an integer;

(h) an output of said syndrome polynomial calculating circuit is entered to said Euclidean algorithm calculating circuit;

(i) results of calculation of an error position polynomial of said Euclidean algorithm calculating circuit are branched into K parts which are respectively entered to said first to Kth chain solution method calculating circuits;

(j) results of calculation of an error value polynomial of said Euclidean algorithm calculating circuit are further branched into K parts which are respectively entered to error value polynomial calculation units of said error value calculating circuits;

(k) outputs of said first to Kth chain solution method calculating circuits are entered to error position inputs of said first to Kth error value calculating circuits;

(l) an output of said shift register circuit and outputs of said first to Kth error value calculating circuits are entered to said error correction circuit;

(m) a Galois field order number is substituted in the first to Kth error value calculating circuits, with the Galois field entered by K orders each time beginning from 1 to K; and wherein (n) said chain solution method calculating circuits, error value calculating circuits, the shift register and the error correction unit are operated with clocks corresponding to 1/K clocks of the input signal; and wherein said syndrome polynomial calculating circuit comprises;

j-blocks of input signals are fed to first to jth D-flipflops;
K Galois filed substitution circuits, each Galois filed substitution circuit connected to receive an output of one of said D-flipflops;
an logical sum circuit connected to receive as inputs thereto, outputs of each of said Galois filed substitution circuits; and wherein an output of said logical sum circuit is issued as an output of the syndrome polynomial calculating circuit, and wherein each of said Galois field substitution circuits comprises:

j Galois field multiplication circuits;
an exclusive OR circuit having (j+1) inputs;
a D-flipflop;
a selector circuit; and
a counter circuit; wherein:

(a) j blocks of time divisionally multiplexed signals are entered as input signals, of which first one block signal is entered to a first input of said exclusive OR circuit, with second to jth block signals being entered to first to (j−1)th Galois field multiplication circuits, respectively;

(b) outputs of said first to (j−1)th Galois field multiplication circuits are fed to second to jth inputs of said exclusive OR circuit;

(c) an output of said exclusive OR circuit is fed to a data input terminal of said D-flipflop;

(d) an output of said D-flipflop is branched into two, one of which is fed to the jth Galois field multiplication circuit and the other of which is entered to a first input of said selector circuit;

(e) an output of said jth Galios field multiplication circuit is fed to a (j+1)th input of said exclusive OR circuit;

(f) input clock signals are fed to a clock terminal of said D-flipflop and to said counter;

(g) a control signal output by said counter is fed to a second input of said selector circuit as a selection control signal;

(h) said counter counts each one-frame signal input and sets the selection control signal to a first logical state when the counter value is at the last inputting of each one-frame signal, and otherwise sets the selection control signal to a second, opposite logical state;

(i) said selector circuit selecting as an output therefrom the output of the D-flipflop fed to the first input of the selector circuit only when the selection control signal has said first logical state; and (j) an output of the D-flipflop and the counter value are reset after inputting of each one-frame input, and wherein (k) the Galois field multiplication circuits have each a Galois field a with power of p to jp.

4. A syndrome polynomial calculating circuit comprising:

a j-bit-length shift register to which input signals are entered in parallel;

j Galois field substitution circuits, each Gaolos field substitution circuit receiving one output of a stage of said shift register and providing an output; and a logical sum circuit having inputs receiving the outputs of said Galois field substitution circuits, and providing a logical sum thereof as a syndrome polynomial calculation output.

5. The syndrome polynomial calculating circuit defined in claim 4, wherein each of said j Galois field substitution circuits comprises:

(a) first to jth Galois field multiplication circuits;

(b) a (j+1) input exclusive OR circuit;

wherein a first block of j blocks of input time-divisionally multiplexed signals is entered to a first input of said exclusive OR gate, second to jth block signals being entered to said first to (j−1)th Galois field multiplication circuits, and outputs of said first to (j−1)th Galois field multiplication circuits being entered to second to jth inputs of said exclusive OR circuit;

(c) a latch circuit for latching an output of said exclusive OR circuit with input clock signals;

(d) a counter for setting a control output signal to a predetermined logic state on counting said input clock signals by one frame; and (e) a gating circuit connected to receive an output of said latch circuit and connected to receive said control signal, said gating circuit selectively outputting the output of said latch circuit based on said control output signal of said counter;

(f) wherein an output of said latch circuit is fed to said jth Galois field multiplication circuit;

(g) wherein an output of said jth Galois field multiplication circuit is connected to a (j+1)st input of said exclusive OR circuit; and (h) wherein multiplication circuits of each Galois field multiplication circuit are designed such that the Galois field a has power of p to jp.

6. A syndrome polynomial calculating circuit comprising:

j stages of a shift register connected in series and receiving j-blocks of input signals;

K Galois field substitution circuits, each connected to receive one output of one of the stages of the shift register;

an OR circuit receiving as an input thereto an output from each of said Galois field substitution circuits;

an output of said OR circuit issued as an output of the syndrome polynomial calculating circuit, where K and j are integers.

7. The syndrome polynomial calculation circuit as recited in claim 6 wherein K is equal to j.

8. A syndrome polynomial calculating circuit comprising:

j latch circuits connected in series and receiving j-blocks of input signals;

j Galois field substitution circuits, each connected to receive one output of one of the j latch circuits;

an OR circuit receiving as an input thereto an output from each of said Galois field substitution circuits;

an output of said OR circuit issued as an output of the syndrome polynomial calculating circuit, where j is an integers.

9. The syndrome polynomial calculating circuit as recited in claim 8, wherein each of said j Galois field substitution circuits comprises:

(a) first to jth Galois field multiplication circuits;

(b) a (j+1) input exclusive OR circuit;

wherein a first block of j blocks of input time-divisionally multiplexed signals is entered to a first input of said exclusive OR gate, second to jth block signals being entered to said first to (j−1)th Galois field multiplication circuits, and outputs of said first to (j−1)th Galois field multiplication circuits being entered to second to jth inputs of said exclusive OR circuit;

(c) a latch circuit for latching an output of said exclusive OR circuit with input clock signals;

(d) a counter for setting a control output signal to a predetermined logic state on counting said input clock signals by one frame; and (e) a gating circuit connected to receive an output of said latch circuit and connected to receive said control signal, said gating circuit selectively outputting the output of said latch circuit based on said control output signal of said counter;

(f) wherein an output of said latch circuit is fed to said jth Galois field multiplication circuit;

(g) wherein an output of said jth Galois field multiplication circuit is connected to a (j+1)st input of said exclusive OR circuit; and (h) wherein multiplication circuits of each Galois field multiplication circuit are designed such that the Galois field a has power of p to jp.

10. The syndrome polynomial calculating circuit as recited in claim 8, wherein each of said Galois field substitution circuits comprises:

j Galois field multiplication circuits;

an exclusive OR circuit having (j+1) inputs;

a latch circuit;

a selector circuit; and a counter circuit; wherein (a) j blocks of time divisionally multiplexed signals are entered as input signals, of which a first one block signal is entered to a first input of said exclusive OR circuit, with second to jth block signals being entered to inputs of first to (j−1)th Galois field multiplication circuits, respectively;

(b) outputs of said first to (j−1)th Galois field multiplication circuits are fed to second to jth inputs of said exclusive OR circuit;

(c) an output of said exclusive OR circuit is fed to a data input terminal of said latch circuit;

(d) an output of said latch circuit is branched into two, one of which is fed to the jth Galois filed multiplication circuit and the other of which is entered to a first input of said selector circuit;

(e) an output of said jth Galios field multiplication circuit is fed to a (j+1)th input of said exclusive OR circuit;

(f) input clock signals are fed to a clock terminal of said latch circuit to said counter;

(g) a control signal output by said counter is fed to a second input of said selector circuit as a selection control signal;

(h) said counter counts each one-frame signal input and sets the selection control signal to a first logical state when the counter value is at the last inputting of each one-frame signal, and otherwise sets the selection control signal to a second, opposite logical state;

(i) said selector circuit selecting as an output therefrom the output of the latch circuit fed to the first input of the selector circuit only when the selection control signal has said first logical state; and (j) an output of the latch circuit and the counter value are reset after inputting of each one-frame input, and wherein (k) the Galois field multiplication circuits have each a Galois field a with power of p to jp.

11. A Reed-Solomon decoding circuit comprising:

(a) a syndrome polynomial calculating circuit;

(b) a Euclidean algorithm calculating circuit;

(c) first to Kth chain solution method calculating circuits, K being an integer;

(d) first to Kth error value calculating circuits;

(e) a shift register circuit; and (f) an error correction circuit; wherein (g) j blocks of input signals are branched into two, one of which is entered to said syndrome polynomial calculating circuit and the other of which is entered to said shift register, j being an integer;

(h) an output of said syndrome polynomial calculating circuit is entered to said Euclidean algorithm calculating circuit;

(i) results of calculation of an error position polynomial of said Euclidean algorithm calculating circuit are branched into K parts which are respectively entered to said first to Kth chain solution method calculating circuits;

(j) results of calculation of an error value polynomial of said Euclidean algorithm calculating circuit are further branched into K parts which are respectively entered to error value polynomial calculation units of said error value calculating circuits;

(k) outputs of said first to Kth chain solution method calculating circuits are entered to error position inputs of said first to Kth error value calculating circuits;

(l) an output of said shift register circuit and outputs of said first to Kth error value calculating circuits are entered to said error correction circuit;

(m) a Galois field order number is substituted in the first to Kth error value calculating circuits, with the Galois field entered by K orders each time beginning from 1 to K; and wherein (n) said chain solution method calculating circuits, error value calculating circuits, the shift register and the error correction unit are operated with clocks corresponding to 1/K clocks of the input signal; and wherein said syndrome polynomial calculating circuit comprises:

j-blocks of input signals are fed to first to jth latch circuits;

K Galois filed substitution circuits, each Galois filed substitution circuit connected to receive an output of one of said latch circuits;

a OR circuit connected to receive as inputs thereto, outputs of each of said Galois filed substitution circuits; and wherein an output of said OR circuit is issued as an output of the syndrome polynomial calculating circuit, and wherein each of said Galois field substitution circuits comprises:

j Galois field multiplication circuits;

an exclusive OR circuit having (j+1) inputs;

a latch;

a selector circuit; and a counter circuit; wherein:

(a) j blocks of time divisionally multiplexed signals are entered as input signals, of which first one block signal is entered to a first input of said exclusive OR circuit, with second to jth block signals being entered to first to (j−1)th Galois field multiplication circuits, respectively;

(b) outputs of said first to (j−1)th Galois field multiplication circuits are fed to second to jth inputs of said exclusive OR circuit;

(c) an output of said exclusive OR circuit is fed to a data input terminal of said latch;

(d) an output of said latch is branched into two, one of which is fed to the jth Galois field multiplication circuit and the other of which is entered to a first input of said selector circuit;

(e) an output of said jth Galios field multiplication circuit is fed to a (j+1)th input of said exclusive OR circuit;

(f) input clock signals are fed to a clock terminal of said latch and to said counter;

(g) a control signal output by said counter is fed to a second input of said selector circuit as a selection control signal;

(h) said counter counts each one-frame signal input and sets the selection control signal to a first logical state when the counter value is at the last inputting of each one-frame signal, and otherwise sets the selection control signal to a second, opposite logical state;

(i) said selector circuit selecting as an output therefrom the output of the latch fed to the first input of the selector circuit only when the selection control signal has said first logical state; and (j) an output of the latch and the counter value are reset after inputting of each one-frame input, and wherein (k) the Galois field multiplication circuits have each a Galois field a with power of p to jp.

12. A Reed-Solomon decoding circuit comprising:

(a) a syndrome polynomial calculating circuit;

(b) a Euclidean algorithm calculating circuit;

(c) first to Kth chain solution method calculating circuits, K being an integer;

(d) first to Kth error value calculating circuits;

(e) a shift register circuit; and (f) an error correction circuit; wherein (g) j blocks of input signals are branched into two, one of which is entered to said syndrome polynomial calculating circuit and the other of which is entered to said shift register, j being an integer;

(h) an output of said syndrome polynomial calculating circuit is entered to said Euclidean algorithm calculating circuit;

(i) results of calculation of an error position polynomial of said Euclidean algorithm calculating circuit are branched into K parts which are respectively entered to said first to Kth chain solution method calculating circuits;

(j) results of calculation of an error value polynomial of said Euclidean algorithm calculating circuit are further branched into K parts which are respectively entered to error value polynomial calculation units of said error value calculating circuits;

(k) outputs of said first to Kth chain solution method calculating circuits are entered to error position inputs of said first to Kth error value calculating circuits;

(l) an output of said shift register circuit and outputs of said first to Kth error value calculating circuits are entered to said error correction circuit;

(m) a Galois field order number is substituted in the first to Kth error value calculating circuits, with the Galois field entered by K orders each time beginning from 1 to K; and wherein (n) said chain solution method calculating circuits, error value calculating circuits, the shift register and the error correction unit are operated with clocks corresponding to 1/K clocks of the input signal; and wherein said syndrome polynomial calculating circuit comprises:

j-blocks of input signals are fed to first to jth latch circuits;

K Galois filed substitution circuits, each Galois filed substitution circuit connected to receive an output of one of said latch circuits;

a OR circuit connected to receive as inputs thereto, outputs of each of said Galois filed substitution circuits; and wherein an output of said OR circuit is issued as an output of the syndrome polynomial calculating circuit, and wherein each of said Galois field substitution circuits comprises:

(a) first to jth Galois field multiplication circuits;

(b) a (j+1) input exclusive OR circuit;

wherein a first block of j blocks of input time-divisionally multiplexed signals is entered to a first input of said exclusive OR gate, second to jth block signals being entered to said first to (j−1)th Galois field multiplication circuits, and outputs of said first to (j−1)th Galois field multiplication circuits being entered to second to jth inputs of said exclusive OR circuit;

(c) a latch circuit for latching an output of said exclusive OR circuit with input clock signals;

(d) a counter for setting a control output signal to a predetermined logic state on counting said input clock signals by one frame; and (e) a gating circuit connected to receive an output of said latch circuit and connected to receive said control signal, said gating circuit selectively outputting the output of said latch circuit based on said control output signal of said counter;

(f) wherein an output of said latch circuit is fed to said jth Galois field multiplication circuit;

(g) wherein an output of said jth Galois field multiplication circuit is connected to a (j+1)st input of said exclusive OR circuit; and (h) wherein multiplication circuits of each Galois field multiplication circuit are designed such that the Galois field a has power of p to jp.

* * * * *